(12) United States Patent  
Mohammed et al.

(10) Patent No.: US 9,947,643 B2
(45) Date of Patent: Apr. 17, 2018

(54) INVERTED OPTICAL DEVICE

(71) Applicant: Invensas Corporation, San Jose, CA (US)

(72) Inventors: Ilyas Mohammed, Santa Clara, CA (US); Masud Beroz, Morrisville, NC (US); Liang Wang, Milpitas, CA (US)

(73) Assignee: INVENSAS CORPORATION, San Jose, CA (US)

( * ) Notice: Subject to any disclaimer, the term of this patent is extended or adjusted under 35 U.S.C. 154(b) by 4 days.

(21) Appl. No.: 15/075,899

(22) Filed: Mar. 21, 2016

(65) Prior Publication Data

US 2016/0204091 A1  Jul. 14, 2016

Related U.S. Application Data

(62) Division of application No. 13/299,714, filed on Nov. 18, 2011, now Pat. No. 9,293,641.

(51) Int. Cl.
*H01L 33/62* (2010.01)
*H01L 25/16* (2006.01)
*H01L 33/06* (2010.01)
*H01L 33/22* (2010.01)
*H01L 33/32* (2010.01)
*H01L 33/60* (2010.01)
*H01L 33/00* (2010.01)
*H01L 33/58* (2010.01)

(52) U.S. Cl.
CPC ........ *H01L 25/167* (2013.01); *H01L 33/0079* (2013.01); *H01L 33/06* (2013.01); *H01L 33/22* (2013.01); *H01L 33/32* (2013.01); *H01L 33/60* (2013.01); *H01L 33/62* (2013.01); *H01L 33/58* (2013.01); *H01L 2924/0002* (2013.01)

(58) Field of Classification Search
None
See application file for complete search history.

(56) References Cited

U.S. PATENT DOCUMENTS

| 5,940,683 | A | 8/1999 | Holm et al. |
| 6,788,011 | B2 * | 9/2004 | Mueller ............... G09G 3/2014 |
| | | | 315/292 |
| 2004/0235210 | A1 | 11/2004 | Tamura et al. |
| 2006/0105482 | A1 | 5/2006 | Klferink et al. |
| 2006/0276005 | A1 | 12/2006 | Yang |
| 2007/0093037 | A1 | 4/2007 | Zhu et al. |
| 2008/0068845 | A1 * | 3/2008 | Aida ............... B29D 11/00278 |
| | | | 362/311.06 |
| 2008/0174004 | A1 | 7/2008 | Nakagawa |
| 2008/0179611 | A1 | 7/2008 | Chitnis et al. |

(Continued)

*Primary Examiner* — Fazli Erdem
*Assistant Examiner* — Scott R Wilson
(74) *Attorney, Agent, or Firm* — Forefront IP Lawgroup of Christie & Rivera, PLLC; Emmanuel A. Rivera

(57) ABSTRACT

Inverted optical device. In accordance with an embodiment of the present invention, a plurality of piggyback substrates are attached to a carrier wafer. The plurality of piggyback substrates are dissimilar in composition to the carrier wafer. The plurality of piggyback substrates are processed, while attached to the carrier wafer, to produce a plurality of integrated circuit devices. A flip wafer is attached to the plurality of light emitting diodes, away from the carrier wafer and the carrier wafer is removed. The plurality of light emitting diodes may be singulated to form individual light emitting diode devices.

18 Claims, 10 Drawing Sheets

(56) References Cited

U.S. PATENT DOCUMENTS

| | | | |
|---|---|---|---|
| 2009/0179207 A1* | 7/2009 | Chitnis | H01L 33/44 257/88 |
| 2011/0037367 A1* | 2/2011 | Wang | F21V 29/63 313/46 |
| 2012/0086023 A1* | 4/2012 | Veerasamy | C03C 17/009 257/88 |
| 2012/0299143 A1 | 11/2012 | Stern | |
| 2013/0126921 A1 | 5/2013 | Mohammed et al. | |

* cited by examiner

INVERTED OPTICAL DEVICE

FIELD OF INVENTION

Embodiments of the present invention relate to the field of integrated circuit design and manufacture. More specifically, embodiments of the present invention relate to systems and methods for inverted optical devices.

BACKGROUND

Silicon is the most common substrate material utilized for integrated circuit fabrication. Accordingly, much of the fabrication process machinery is targeted for use with Silicon. The current state of the art fabrication facilities utilize 200 mm ("8 inch") to 300 mm ("12 inch") diameter Silicon wafers. In general, a fabrication facility and a fabrication process are more efficient, e.g., produce more integrated circuits in less time and/or at a lower cost, using a larger wafer size.

A variety of integrated circuit devices benefit from, or require, non-Silicon substrates, for example, light emitting diodes or lasers, optical waveguides, radio-frequency circuits, low power circuitry or radiation hardened circuitry. Wafers grown using materials other than silicon are generally only available in smaller wafer sizes, for a variety of reasons including crystal growth characteristics, mechanical strength and the like. For example, such non-Silicon wafers are generally not available in sizes over 100 mm.

SUMMARY OF THE INVENTION

Therefore, what is needed are systems and methods for inverted optical devices. What is additionally needed are systems and methods for inverted optical devices that enable dissimilar substrates to benefit from process machinery optimized for large substrates. A further need exists for systems and methods for inverted optical devices that are compatible and complementary with existing systems and methods of integrated circuit design, manufacturing and test. Embodiments of the present invention provide these advantages.

In a first method embodiment in accordance with the present invention, a plurality of piggyback substrates are attached to a carrier wafer. The plurality of piggyback substrates are dissimilar in composition to the carrier wafer. The plurality of piggyback substrates are processed, while attached to the carrier wafer, to produce a plurality of integrated circuit devices. A flip wafer is attached to the plurality of light emitting diodes, away from the carrier wafer and the carrier wafer is removed. The plurality of light emitting diodes may be singulated to form individual light emitting diode devices.

In accordance with another embodiment of the present invention, a method includes bonding a piggyback substrate to a carrier wafer and fabricating a light emitting diode on the piggyback substrate while bonded to the carrier wafer. The method also includes attaching a flip wafer to the top of the light emitting diode, away from the carrier wafer and separating the piggyback substrate from the light emitting diode. The carrier wafer may also be removed.

In accordance with yet another embodiment of the present invention, an apparatus includes a non-conducting substrate structure. The apparatus also includes a light emitting diode semiconductor structure having a pair of contact surfaces, wherein the pair of contact surfaces face the substrate structure. The apparatus further includes an insulating, inorganic material coupling the light emitting diode semiconductor structure to the substrate structure.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Figure 1A:
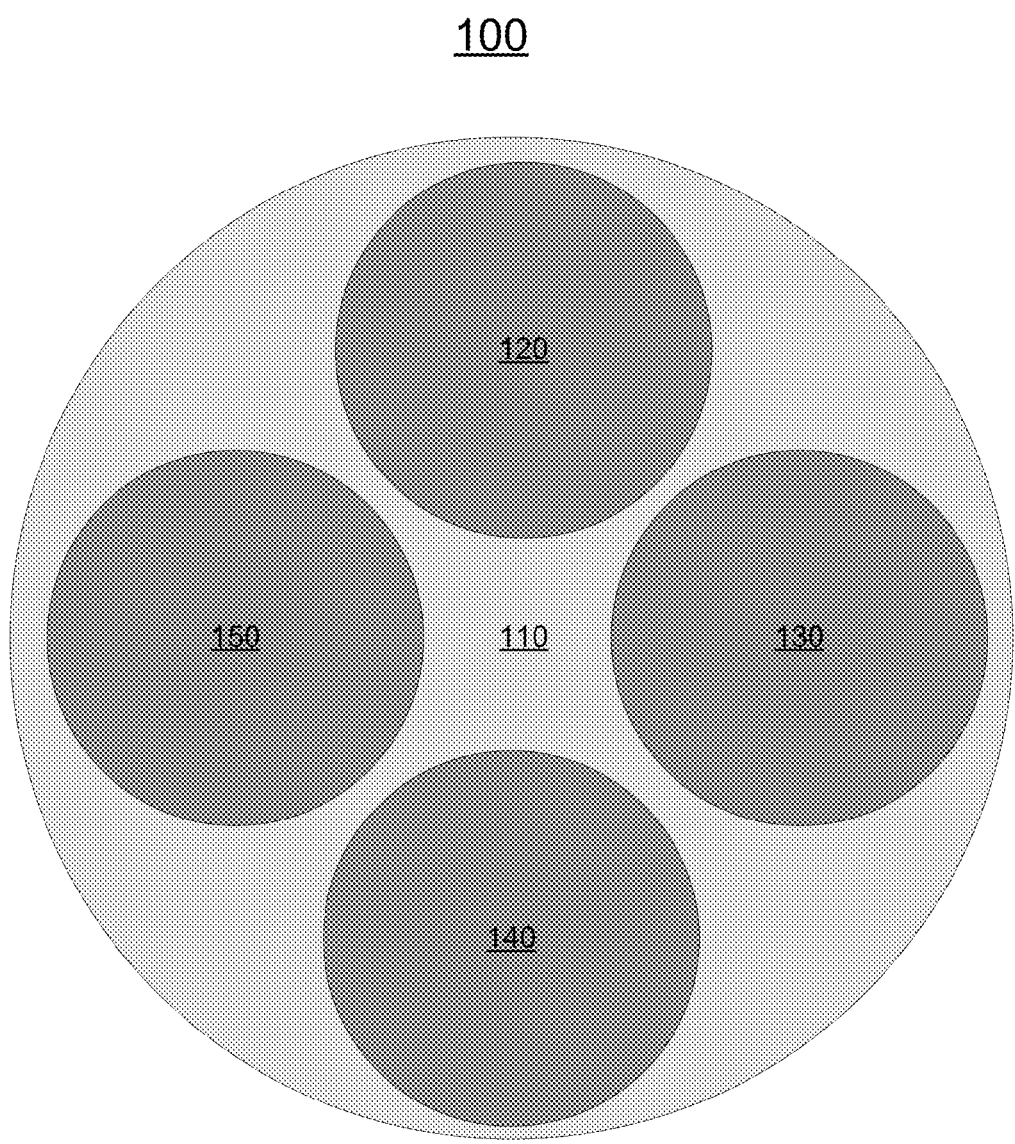
FIG. 1A illustrates a plan view of an exemplary integrated circuit manufacturing arrangement, in accordance with embodiments of the present invention.

Reference will now be made in detail to various embodiments of the invention, front facing piggyback wafer assembly, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., processes 400, 470 and 500) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "attaching" or "processing" or "singulating" or "processing" or "forming" or "roughening" or "filling" or "accessing" or "performing" or "generating" or "adjusting" or "creating" or "executing" or "continuing" or "indexing" or "computing" or "translating" or "calculating" or "determining" or "measuring" or "gathering" or "running" or the like, refer to the action and processes of a computer system, or similar electronic computing device, e.g., a computer controlled integrated circuit manufacturing system, that manipulates and transforms data represented as physical (electronic) quantities within the computer system's registers and memories into other data similarly represented as physical quantities within the computer system memories or registers or other such information storage, transmission or display devices.

As used herein, the term "carrier wafer" is not intended to limit the function of such a wafer. For example, a "carrier wafer" may include a variety of circuits and/or structures, and a "carrier wafer" is not limited to only carrying other structures.

Inverted Optical Device

FIG. 1A illustrates a plan view of an exemplary integrated circuit manufacturing arrangement 100, in accordance with embodiments of the present invention. Arrangement 100 comprises a first, "large," carrier wafer 110 and a plurality of smaller, "piggyback" wafers, 120, 130, 140 and 150. Wafer flats or notches, if any, are not illustrated. In the exemplary embodiment of FIG. 1A, wafer 110 is nominally 300 mm, also known as an "12 inch" wafer. Piggyback wafers 120-150 are 76.2 mm ("3-inch") wafers. These sizes are exemplary, and not intended to be limiting. It is to be appreciated that embodiments in accordance with the present invention are well suited to a variety of wafer sizes, shapes and materials for both carrier and piggyback wafers.

Piggyback wafers 120-150 generally comprise a non-Silicon substrate. Common non-Silicon substrates include sapphire ($\alpha$-$Al_2O_3$), Gallium Nitride (GaN), Gallium Arsenide (GaAs), Gallium Phosphide (GaP), Lithium Tantalate (LiTa), Lithium Niobate (LiN), Indium Arsenide (InAs), Indium Phosphide (InP), Silicon Carbide (SiC), and Germanium (Ge). In general, the size of piggyback wafers 120-150 is limited to be less than the size of carrier wafer 110. For example, crystal growth characteristics and/or mechanical properties of a non-Silicon substrate may limit the size of piggyback wafers 120-150 to less than the size of a larger, "modern" Silicon substrate.

It is to be appreciated that piggyback wafers 120-150 may also comprise Silicon, in whole or in part. Other factors may make use of piggyback wafers 120-150 comprising Silicon substrates desirable. For example, a critical process step may be performed on piggyback wafers 120-150 on a fabrication line that is limited to relatively smaller wafers.

Carrier wafer 110 may comprise Silicon, or any other material suitable for the processing environment of piggyback wafers 120-150, including, for example, glass, quartz, fused silica, metals and the like. Characteristics of concern include process temperature, compatibility with process ambient gasses, mechanical strength, flatness, resistance to vibration, suitability to bonding with the piggyback wafers, and the like. Carrier wafer 110 should be sufficiently large to attach at least two piggyback wafers, e.g., piggyback wafers 120, 130.

Piggyback wafers 120-150 are attached or bonded to carrier wafer 110 via any suitable attachment method, for example, direct bonding, oxide to oxide bonding, anodic bonding, brazing, diffusion bonding, eutectic bonding, plasma activated bonding, glass frit bonding, adhesive bonding, reactive bonding and the like. Piggyback wafers 120-150 may comprise substantially unprocessed, e.g., blank, substrates, or may have had some processing prior to attachment to carrier wafer 110.

After attachment, a series of integrated circuit processing operations may be performed on piggyback wafers 120-150, while attached to carrier wafer 110, as part of integrated circuit manufacturing arrangement 100. For example, such processing may be described as forming a semiconducting structure on the piggyback wafers 120-150. Alternatively, such processing may be described as forming an active layer on the piggyback wafers 120-150. An active layer may include devices such as transistors, diodes, capacitors, resistors, inductors, filters, e.g., comb filters, and the like. In this novel manner, carrier wafer 110 enables piggyback wafers 120-150 to be processed on fabrication equipment intended for wafers larger than the individual piggyback wafers 120-150.

Figure 1B:
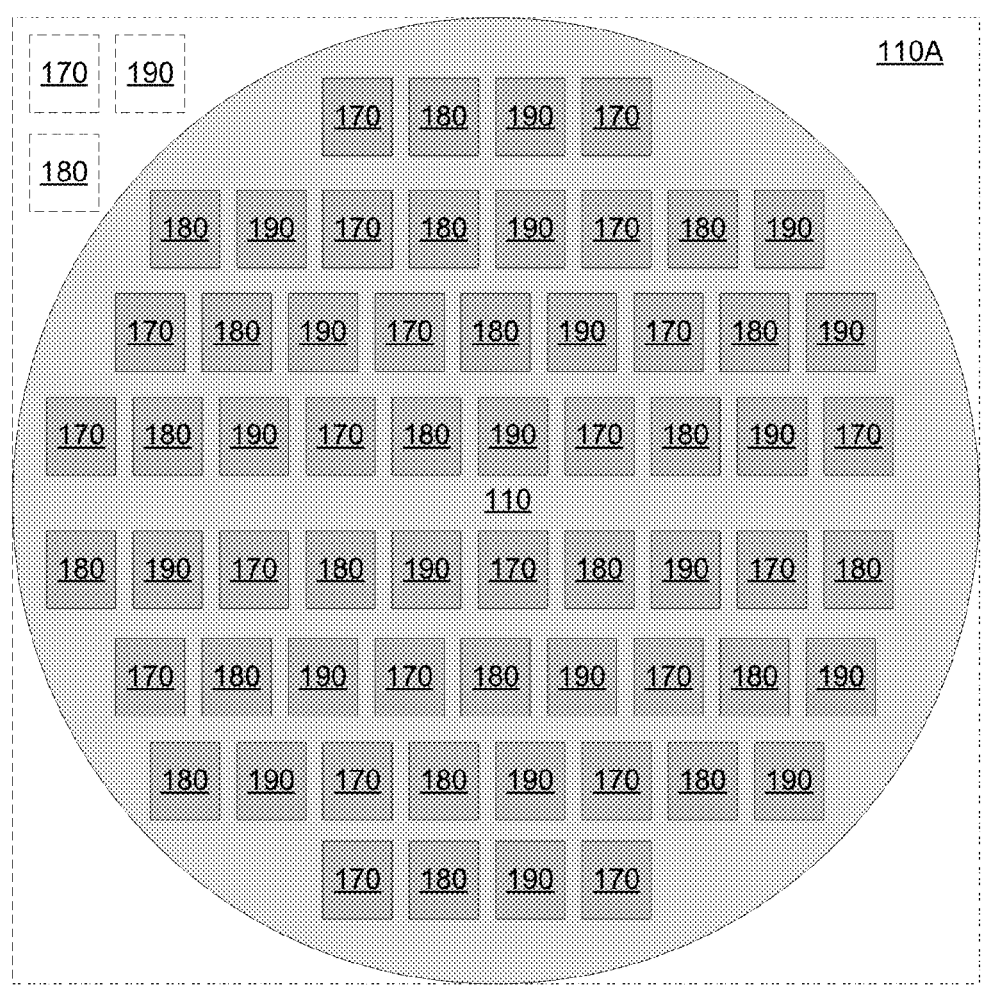
FIG. 1B illustrates a plan view of an exemplary integrated circuit manufacturing arrangement, in accordance with embodiments of the present invention.

FIG. 1B illustrates a plan view of an exemplary integrated circuit manufacturing arrangement 160, in accordance with embodiments of the present invention. Arrangement 160 comprises a first, "large," carrier wafer 110 and a plurality of "piggybacked," singulated dice 170-190. Wafer flats or notches, if any, are not illustrated. FIG. 1B illustrates two possible shapes (plan view) for wafer 110, e.g., generally circular and generally square, 110A, illustrated with dotted lines. A variety of shapes for a carrier wafer are well-suited to embodiments in accordance with the present invention. Piggyback dice 170-190 may comprise a Silicon or non-Silicon substrate.

It may be desirable to singulate dice 170, 180 and 190 prior to a completion of fabrication activities. For example, mechanical strength or crystal orientation characteristics may make singulation of dice 170-190 impractical after completion of all fabrication processing.

In addition, singulation of dice 170-190 prior to attachment to carrier wafer 110, as illustrated in exemplary integrated circuit manufacturing arrangement 160, may enable a greater area of carrier wafer 110 to carry devices, in comparison to exemplary integrated circuit manufacturing arrangement 100 (FIG. 1A).

Piggyback dice 170-190 are attached or bonded to carrier wafer 110 via any suitable attachment method, for example, direct bonding, oxide to oxide bonding, anodic bonding, brazing, diffusion bonding, eutectic bonding, plasma activated bonding, glass frit bonding, adhesive bonding, reactive bonding and the like. Piggyback dice 170-190 may comprise substantially unprocessed substrates, or may have undergone some processing prior to attachment to carrier wafer 110.

It is to be appreciated that plurality of dice 170-190 need not be of the same size, shape or design, and need not have the same type of substrate, in accordance with embodiments of the present invention. For example, an instance of die 170 may be a blue light emitting diode comprising a sapphire substrate. An instance of die 180 may be a green light emitting diode comprising a Gallium phosphide (GaP) substrate. An instance of die 190 may be a red light emitting diode comprising a Gallium arsenide (GaAs) substrate. The three instances of dice 170-190 may be arranged in an array on carrier wafer 110 such that the light from such three primary colors may be combined to produce a variety of spectral colors.

After attachment, a series of integrated circuit processing operations may be performed on piggyback dice 170-190, while attached to carrier wafer 110, as part of integrated circuit manufacturing arrangement 160. For example, such operations may be described as forming a semiconducting structure on the piggyback dice 170-190. Alternatively, such processing may be described as forming an active layer on the piggyback dice 170-190. An active layer may include devices such as transistors, diodes, capacitors, resistors, inductors, filters, e.g., comb filters, and the like. In this novel manner, carrier wafer 110 enables piggyback dice 170-190 to be processed on fabrication equipment intended for wafers, after singulation of dice 170-190.

Further with respect to FIGS. 1A and 1B, it is to be appreciated that wafer 110 may comprise mechanical and/or electrical features, applied prior to and/or after attachment of piggyback wafers 120-150 (FIG. 1A) or dice 170 (FIG. 1B). For example, wafer 110 may comprise passive electrical features, e.g., "wires," to couple instances of dice 170-190. Wafer 110 may also comprise active electrical features, e.g., logic gates, power supply features, drive electronics and/or complex integrated circuits, e.g., a microprocessor, to couple to dice 170-190.

It is to be appreciated that embodiments in accordance with the present invention are well suited to a variety of plan-view shapes for carrier wafer 110. For example, carrier wafer 110 may be generally circular, with or without a flat or a notch. In addition, carrier wafer 110 may be rectangular or any other suitable shape, e.g., a hexagon. A wide variety of factors should be considered in selecting a shape for carrier wafer 110, including, for example, medium growth characteristics, processing equipment features and/or requirements, and desired placement of piggyback wafers, e.g., 120-150 (FIG. 1A), and/or desired placement of singulated dice, e.g., 170-190 (FIG. 1B). For example, it may be advantageous to place rectangular singulated dice on a rectangular carrier wafer.

Figure 2:
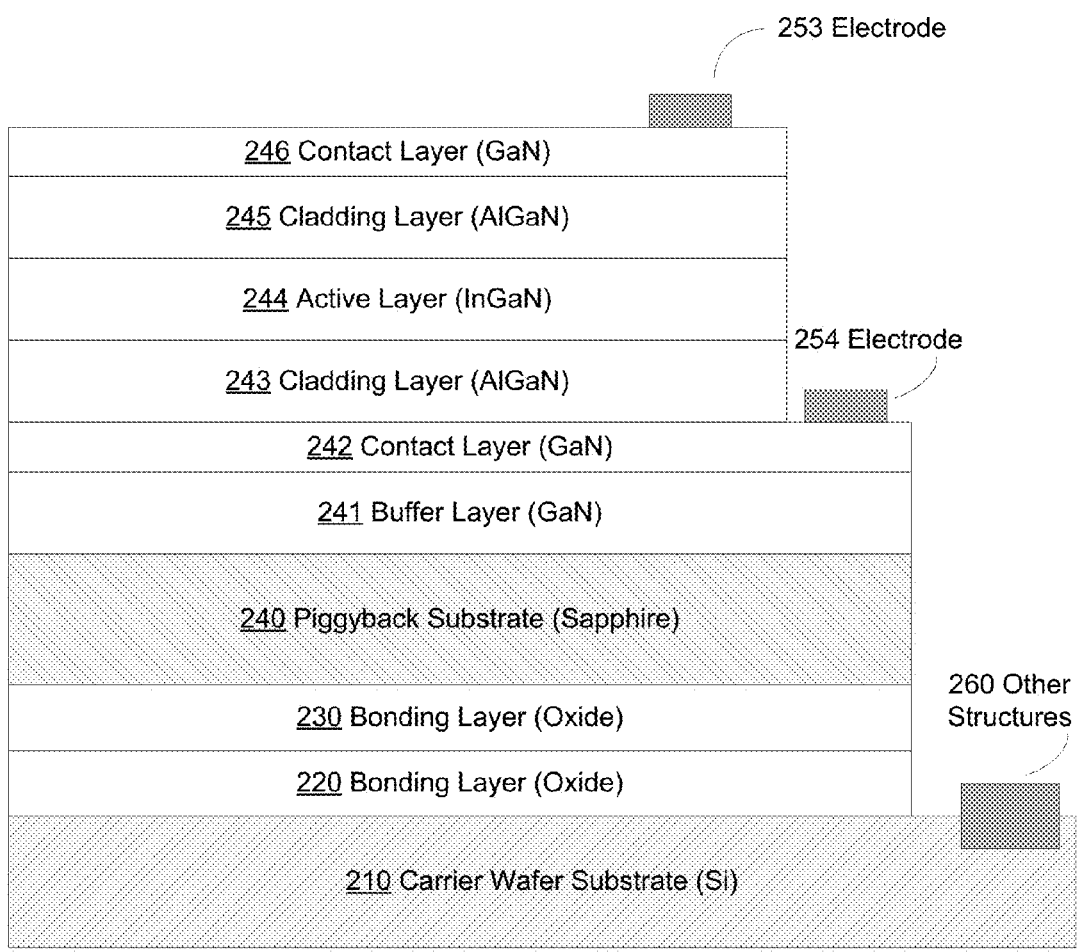
FIG. 2 illustrates a cross sectional view of an exemplary integrated circuit manufacturing arrangement, in accordance with embodiments of the present invention.

FIG. 2 illustrates a cross sectional view of an exemplary integrated circuit manufacturing arrangement 200, in accordance with embodiments of the present invention. Arrangement 200 generally corresponds to a section of arrangement 100 through a piggyback wafer 120 (FIG. 1A), or a section of arrangement 160 through a piggyback die 170 (FIG. 1B). The material types and numbers of layers set forth are exemplary, and not intended to be limiting.

In accordance with an embodiment of the present invention, integrated circuit manufacturing arrangement 200 comprises a carrier wafer 210 comprising, for example, Silicon. It is to be appreciated that embodiments in accordance with the present invention are well suited to a carrier wafers comprising a variety of materials, including, for example, glass, quartz, fused silica, metals and the like. A piggyback substrate 240 comprising, for example, sapphire, is bonded to carrier wafer 210 via oxide to oxide bonding, producing bonding layers 220, 230.

After piggyback substrate 240, for example, as a wafer (FIG. 1A) or as a singulated die (FIG. 1B), is attached to carrier wafer 210, well-known integrated circuit fabrication operations are performed on piggyback substrate 240 while attached to carrier wafer 210. It is to be appreciated that well-known integrated circuit fabrication operations may also be performed on carrier wafer 210.

In an exemplary embodiment, a GaN buffer layer 241, which may be undoped, is formed on sapphire substrate 240. Layer 241, or any layer formed on a substrate may be referred to as a first sequentially fabricated layer of the light emitting diode. An n-type GaN contact layer 242 is formed on buffer layer 241. An optional n-type AlGaN cladding layer 243 may be formed on contact layer 242. A p-type InGaN active layer 244 is formed on cladding layer 243. The active layer 244 may also be a multiple quantum well (MQW) structure which is responsible for light emission, for example, a MQW comprising InGaN/GaN units that emit blue light. A p-type AlGaN cladding layer of electron blocking layer (EBL) 245 is formed on active layer 244, and a p-type GaN contact layer 246 is formed on cladding layer 245. Layer 246 may be referred to as a last sequentially fabricated layer of the light emitting diode. The stack may be annealed in a Nitrogen atmosphere at about 700° C., forming a blue LED. Electrodes 253 and 254 are added to contact the integrated circuit device.

Integrated circuit manufacturing arrangement 200 may also comprise integrated circuits or other structures 260 formed on and/or in carrier wafer 210, including, for example, passive electrical features, e.g., "wires," and/or active electrical features, e.g., logic gates, driver circuits, radio frequency circuits, highly integrated circuits, e.g., a microprocessor, and/or power supply features, and/or other structures, including, for example, microelectromechanical systems (MEMS). The formation of other structures 260 may occur prior to and/or after attachment of piggyback substrate 240 to carrier wafer 210. The indicated location of other structures 260 is exemplary, and not intended to be limiting. For example, a portion or all of other structures 260 may be located under, e.g., within the vertical projection of, piggyback substrate 240.

Figure 3:
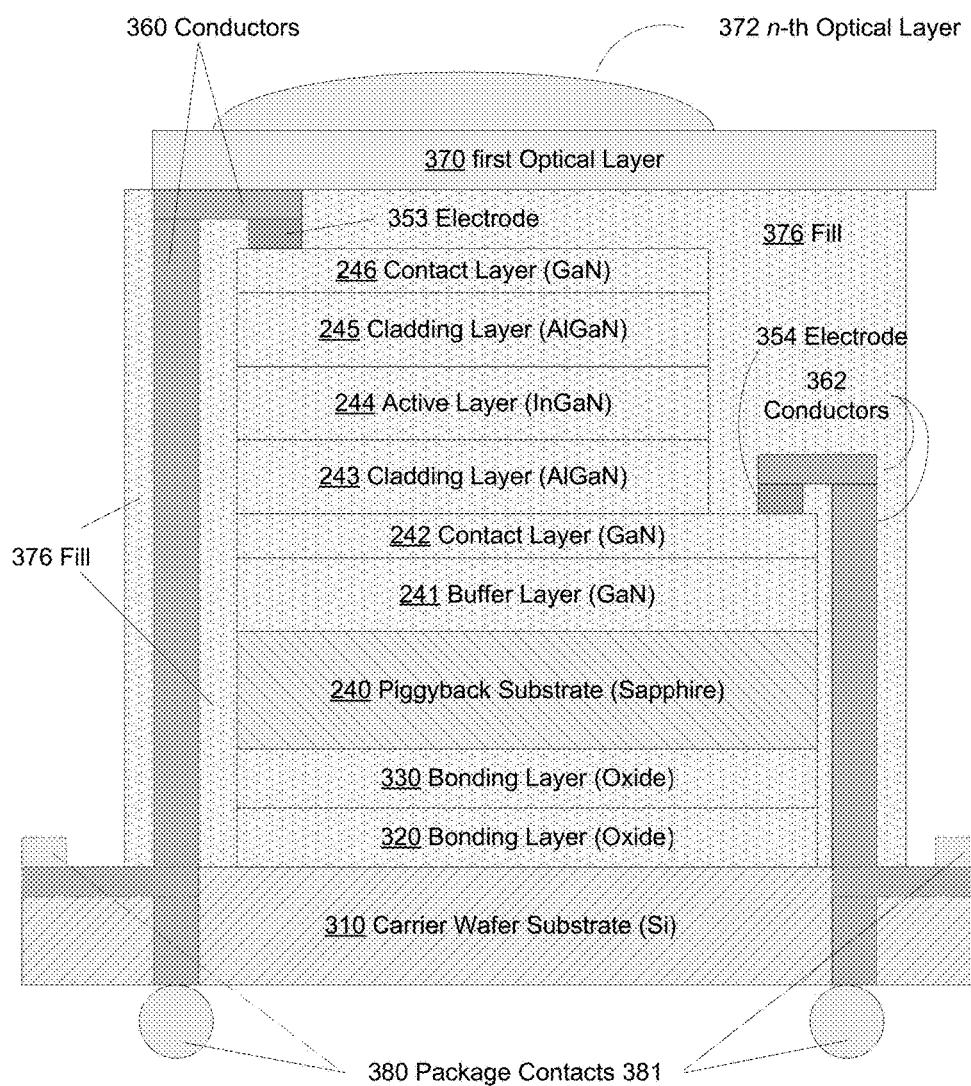
FIG. 3 illustrates a cross sectional view of an exemplary light emitting diode device, in accordance with embodiments of the present invention.

FIG. 3 illustrates a cross sectional view of an exemplary light emitting diode device 300, in accordance with embodiments of the present invention. Light emitting diode device 300 comprises a light emitting diode formed on a sapphire substrate comprising layers 240-246, as previously described with respect to FIG. 2.

In addition to layers 240-246, light emitting diode device 300 comprises package contacts 380 and 381. Package contacts 380 and 381 electrically couple the electronics of light emitting diode device 300 to outside electronics, and may comprise, for example, solder balls, Controlled Collapse Chip Connection ("C4") and/or wire bonding contacts. Package contacts 380, 381 may be formed on the secondary or back side of carrier wafer substrate 310, although that is not required. Similar to carrier wafer 210 (FIG. 2), carrier wafer substrate 310 may comprise Silicon or other materials including, for example, glass, quartz, fused silica and/or metals, in accordance with embodiments of the present invention.

In accordance with embodiments of the present invention, package contacts 380, 381 may be formed on the front or primary surface, e.g., on the same side as piggyback substrate 240, of carrier wafer substrate 310. This arrangement is illustrated with dotted lines in FIG. 3. Such arrangement may be compatible with package wiring processes and structures, for example, wire bonding.

Light emitting diode device 300 further comprises bonding layers 320, 330. Bonding layers 320, 330 are generally similar to bonding layers 220, 230 as described in FIG. 2, and may result from and/or be required for attachment or bonding of piggyback substrate 240 to carrier wafer substrate 310.

Light emitting diode device 300 further comprises conductors 360 and 362 for coupling package contacts 380 and 381 to the contact layers 246 and 244 respectively, of the light emitting diode 240-246. Conductors 360 and 362 may comprise vias, for example, or any other suitable conductive technology. Conductors 360 and 362 need not be the same material, nor constructed utilizing the same techniques throughout light emitting diode device 300. Conductor 360 electrically couples package contact 380 to contract layer 246 through electrode 353. Similarly, conductor 362 electrically couples package contact 381 to contract layer 244 through electrode 354.

A fill material 376 encompasses layers 320, 330, 240-246, 260, 262, 353 and 354. Fill material 376 is on top of carrier wafer substrate 310. Fill material 376 comprises any suitable fill material, and may form a protective encapsulant, suitable for providing environmental and handling protection. Fill material 376 should be a good electrical insulator.

On top of fill material 376, a plurality of optical layers, e.g., first optical layer 370 and n-th optical layer 372 are fabricated. The optical layers function to couple the light emitted from the light emitting diode 240-246 to free space. One or more of optical layers 370-372 may form optical lenses. In general, a plurality of optical layers should form a progression of refractive indices from the refractive index of the LED itself to that of air. For example, the optical layer material with the highest refractive index should be closest to the LED, and the optical layer material with the lowest refractive index should be farthest from the LED.

In accordance with embodiments of the present invention, one or more of optical layers 370-372 may comprise a coating of phosphor(s) to produce a phosphor-based white LED.

Table 1, below, list some potentially suitable materials for use as optical layer materials and their corresponding refractive indices, in accordance with embodiments of the present invention.

TABLE 1

| Material | Refractive Index |
| --- | --- |
| Zirconia ($ZrO_2$) | 2.2 |
| Lithium niobate ($LiNbO_3$) | 2.3 |
| Potassium Niobate ($KNbO_3$) | 2.28 |
| Silicon nitride ($Si_3N_4$) | 2.0404 |
| Cadmium indate ($CdIn_2O_4$) | 2.58 |
| Hafnia ($HfO_2$) | 1.9 |
| Strontium titanate ($SrTiO_3$) | 2.472 |
| Titanium dioxide ($TiO_2$) | 2.44 |
| Niobium pentoxide ($Nb_2O_5$) | 2.35 |
| Zinc Oxide (ZnO) | 2.0 |
| Zinc sulfide (ZnS) | 2.419 |
| Molybdenum trioxide ($MoO_3$) | 2.0 |

In this novel manner, light emitting diode device 300 comprises many elements of a complete light emitting diode, ready for a next level packaging. For example, light emitting diode device 300 comprises electrical package contacts, optical devices, e.g., lenses, encapsulant and the like. Light emitting diode device 300 may further comprise electrical devices, e.g., power supplies and/or drive electronics that are generally useful for operation of a light emitting diode.

Additionally, it is to be appreciated that the carrier wafer 310 material, e.g., Silicon, in the final device 300 may facilitate heat transfer from the light emitting diode to higher-level packaging and/or the ambient environment. For example, the thermal conductivity of Silicon, 149 $W \cdot m^{-1} \cdot K^{-1}$, is much greater than that of sapphire, 32 or 35 $W \cdot m^{-1} \cdot K^{-1}$, depending on the orientation.

Figure 4A:
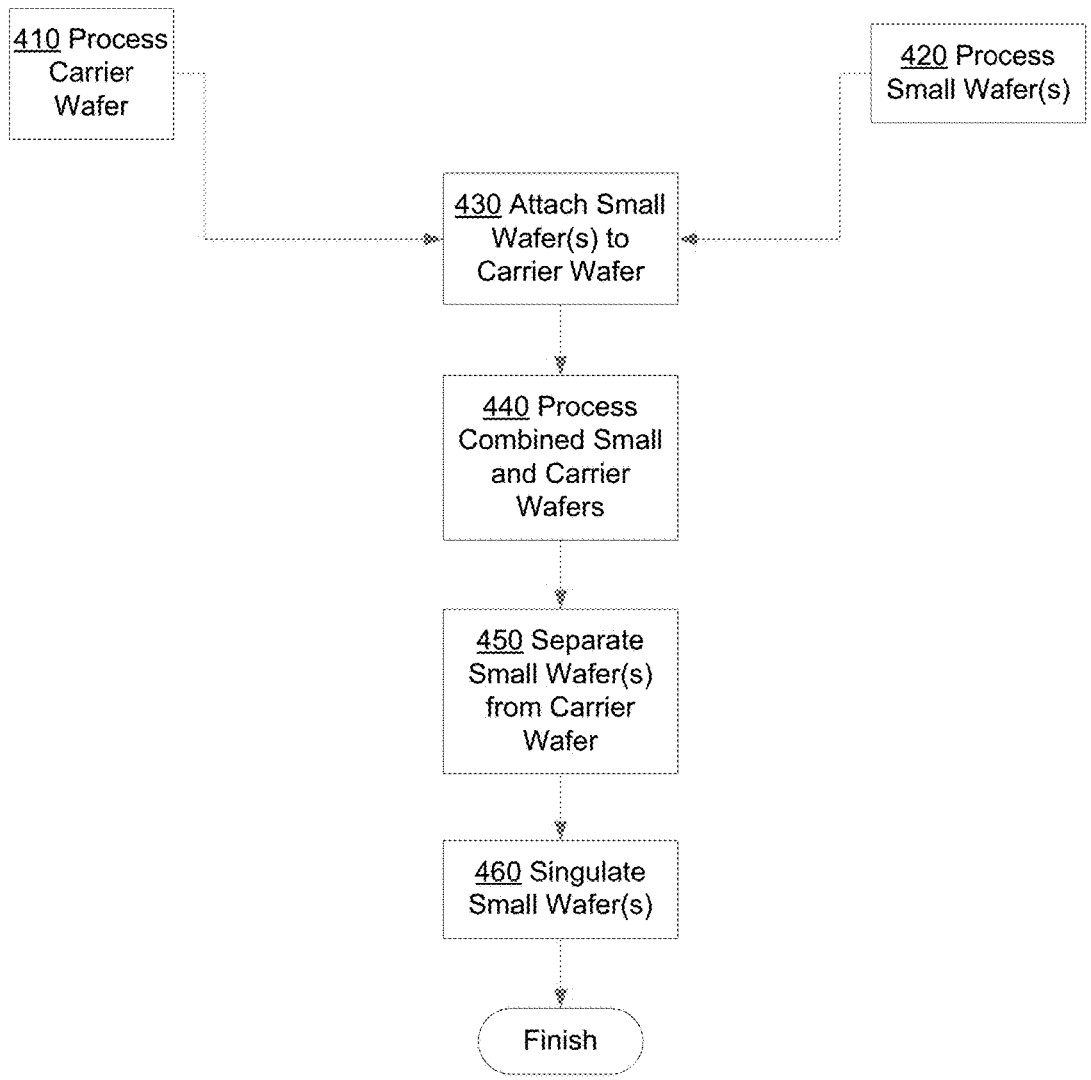
FIG. 4A illustrates a process of piggyback wafer assembly, in accordance with embodiments of the present invention.

FIG. 4A illustrates a process 400 of piggyback wafer assembly, in accordance with embodiments of the present invention. At optional 410, a carrier wafer, e.g., wafer 110 of FIG. 1A, is processed. Such processing may include preparation for attachment of small wafer(s), e.g., at 430, further described below. Such processing may also include well known operations for manufacturing, or the partial manufacture, of integrated circuits or other structures, including, for example, microelectromechanical systems (MEMS), onto a carrier wafer. Such processing may further include formation of conductive vias in a carrier wafer.

At optional 420, a plurality of small wafers, e.g., 120, 130, 140 and/or 150 of FIG. 1A, are processed. It is to be appreciated that the plurality of small wafers will generally be of a different composition than the carrier wafer, although this is not required. For example, the plurality of small wafers may comprise a sapphire substrate, while the carrier wafer may comprise Silicon. Processing operations performed on the plurality of small wafers may include preparation for attachment to a carrier wafer, e.g., at 430. Such processing may also include well known operations for manufacturing, or the partial manufacture, of integrated circuits or other structures, including, for example, microelectromechanical systems (MEMS), onto such wafers.

At 430, the plurality of small wafers is attached to the carrier wafer. Such attachment may utilize any suitable attachment method, for example, direct bonding, oxide to oxide bonding, anodic bonding, brazing, diffusion bonding, eutectic bonding, plasma activated bonding, glass frit bonding, adhesive bonding, reactive bonding and the like.

At 440, the combined plurality of small wafers and the carrier wafer are processed via well known semiconductor processing techniques. For example, such processing may be described as forming a semiconducting structure on the small wafers. Alternatively, such processing may be described as forming an active layer on the piggyback small wafers. An active layer may include devices such as transistors, diodes, capacitors, resistors, inductors, filters, e.g., comb filters, and the like. Both the plurality of small wafers and the carrier wafer may be processed in this manner. For example, integrated circuits and/or other structures, including, for example, microelectromechanical systems (MEMS), may be created on the carrier wafer, the plurality of small wafers or on both types of wafers.

At optional 450, the plurality of small wafers are separated from the carrier wafer. Such separation may utilize any suitable separation method, including chemical and/or mechanical methods. In one exemplary embodiment, a back grinding or lapping operation may remove the carrier wafer.

At 460, the plurality of small wafers are singulated to produce individual die. Any suitable singulation process, e.g., scribing and breaking, mechanical sawing, and/or laser cutting, may be utilized. It is to be appreciated that such the may comprise a portion of a carrier wafer, and may further comprise integrated circuit devices and/or structures formed on or in such a portion of the carrier wafer.

Figure 4B:
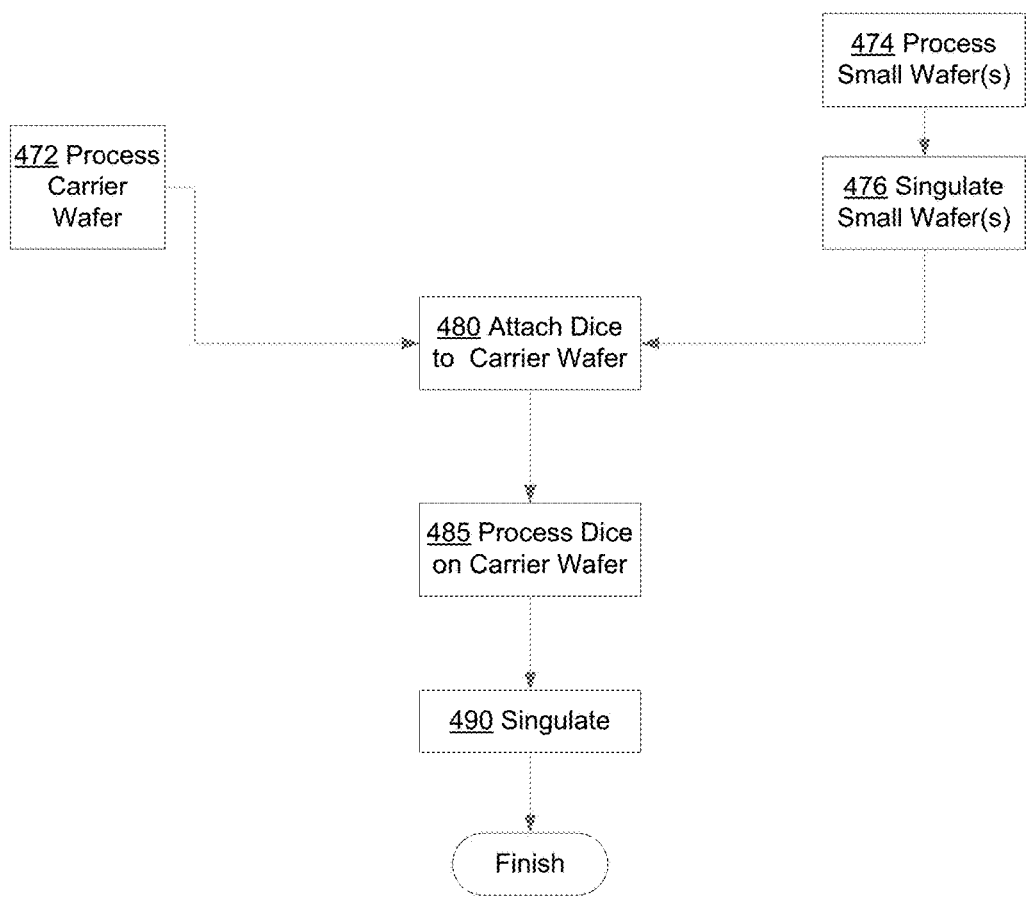
FIG. 4B illustrates a process of piggyback wafer assembly, in accordance with embodiments of the present invention.

FIG. 4B illustrates a process 470 of piggyback wafer assembly, in accordance with embodiments of the present invention. At optional 472, a carrier wafer, e.g., wafer 110 of FIG. 1A, is processed. Such processing may include preparation for attachment of small wafer(s), e.g., at 480, further described below. Such processing may also include well known operations for manufacturing, or the partial manufacture, of integrated circuits or other structures, including, for example, microelectromechanical systems (MEMS), onto a carrier wafer. Such processing may further include formation of conductive vias in a carrier wafer.

At optional 474, a plurality of small wafers, e.g., 120, 130, 140 and/or 150 of FIG. 1A, are processed. Such processing may include preparation for attachment to a carrier wafer, e.g., at 480. Such processing may also include well known operations for manufacturing, or the partial manufacture, of integrated circuits or other structures onto such wafers.

At 476, the plurality of small wafers are singulated. For example, each wafer is converted into a plurality of individual, "piggyback" dice. Any suitable singulation process, e.g., scribing and breaking, mechanical sawing, and/or laser cutting, may be utilized.

At 480, the piggyback dice, from the plurality of small wafers, are attached to the carrier wafer. Such attachment may utilize any suitable attachment method, for example, direct bonding, oxide to oxide bonding, anodic bonding, brazing, diffusion bonding, eutectic bonding, plasma activated bonding, glass frit bonding, adhesive bonding, reactive bonding and the like.

At 485, the combined plurality of piggyback dice on the carrier wafer are processed via well known semiconductor processing techniques. For example, such processing may be described as forming a semiconducting structure on the piggyback dice. Alternatively, such processing may be described as forming an active layer on the piggyback dice. An active layer may include devices such as transistors, diodes, capacitors, resistors, inductors, filters, e.g., comb filters, and the like. Both the plurality of piggyback dice and the carrier wafer may be processed in this manner. For example, integrated circuits and/or other structures, including, for example, microelectromechanical systems (MEMS), may be created on the carrier wafer, the plurality of piggyback dice or on both types of wafers.

It is to be appreciated that the processing at 485 may include formation of structures as illustrated in FIG. 3, for example, conductors 360, 362, fill 376, package contacts 380, 381, and/or optical layers 370, 372.

At 490, a plurality of integrated circuit devices are singulated. It is to be appreciated that a variety of singulation methods are suitable for embodiments in accordance with the present invention. For example, the piggyback dice may be separated from the carrier wafer. Such separation may utilize any suitable separation method, including chemical and/or mechanical methods. In one exemplary embodiment, a back grinding or lapping operation may remove the carrier wafer. It is to be appreciated that such separation from the carrier wafer may result in singulation of the piggyback dice.

In accordance with embodiments of the present invention, well-known singulation techniques may be applied to the combined carrier wafer and piggyback dice. Any suitable singulation process, e.g., scribing and breaking, mechanical sawing, and/or laser cutting, may be utilized. It is to be appreciated that a resulting die may comprise a portion of a carrier wafer. For example, the resulting die may comprise substrate material from the carrier wafer, which may be different from the substrate of the piggyback die. The resulting die may further comprise integrated circuit devices and/or structures formed on or in such a portion of the carrier wafer, for example, as illustrated by other structures 260 of FIG. 2. It is to be further appreciated that the singulated structure may have a larger footprint than the footprint of the piggyback die.

Figure 5A:
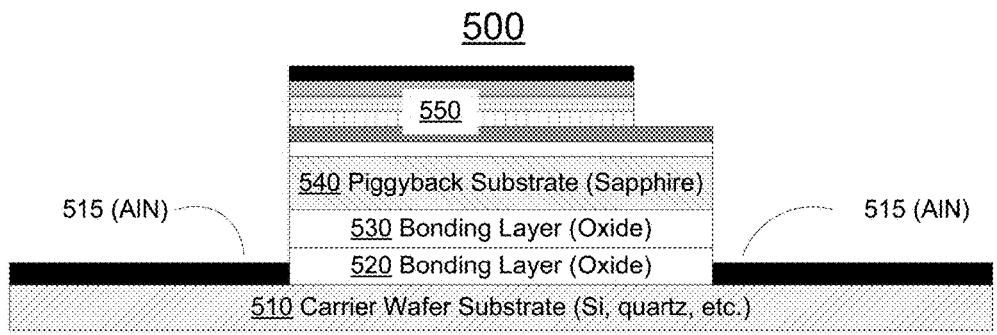
FIGS. 5A, 5B, 5C, 5D, 5E and 5F illustrate a method of manufacturing a light emitting diode assembly, in accordance with embodiments of the present invention.

FIGS. 5A-5F illustrate a method 500 of manufacturing a light emitting diode assembly, in accordance with embodiments of the present invention. In FIG. 5A, light emitting diode layers 550 are formed on a sapphire piggyback substrate 540, after bonding to a carrier wafer substrate 510, comprising, e.g., Silicon, quartz or fused silica. It is appreciated that carrier wafer substrate 510 comprises a crystalline interface with light emitting diode layers 550. It is further appreciated that piggyback substrate 540 may comprise a variety of materials, e.g., sapphire ($\alpha$-$Al_2O_3$), Gallium Nitride (GaN), Gallium Arsenide (GaAs), Gallium Phosphide (GaP), Lithium Tantalate (LiTa), Lithium Niobate (LiN), Indium Arsenide (InAs), Indium Phosphide (InP), Silicon Carbide (SiC), or Germanium (Ge), in accordance with embodiments of the present invention. Bonding layers 520, 530 may be produced as a result of, or to enable, a bonding process. Exemplary materials and manufacturing methods have been previously described. In general, there will be multiple instances of the stack 520, 530, 540 and 550 produced on carrier wafer 510.

FIG. 5A also illustrates the application of an optional sacrificial layer 515, e.g., comprising Aluminum nitride (AlN). Optional sacrificial layer 515 may benefit a separation process, e.g., laser lift off, as described later in FIG. 5E.

Figure 5B:
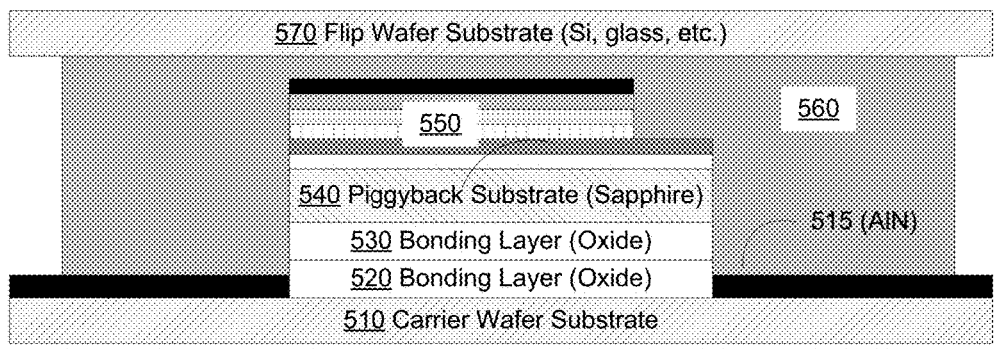

In FIG. 5B, a fill material 560, comprising any suitable fill material, e.g., Silicon dioxide ($SiO_2$) or Silicon nitride ($Si_3N_4$), is formed around and over the LED stack 520, 520, 540 and 550 and over optional sacrificial layer 515, if present. FIG. 5B also illustrates the addition of a "flip" wafer substrate 570, comprising, for example, Silicon, glass, fused silica, plastic-based materials, glass-reinforced epoxy, metal-core printed circuit board (PCB) materials, ceramics and/or organic materials, e.g., as utilized in multi-chip modules, applied to the "top" of the LED stack, e.g., the side away from carrier wafer 510. It is appreciated that the LED stack, layers 550, is not grown or otherwise formed on flip wafer substrate 570. Accordingly, flip wafer substrate 570 does not have a crystalline interface with LED layers 550.

Flip wafer substrate 570 can attached to 560 and/or 550 through bonding techniques including, for example, direct bonding, oxide to oxide bonding, diffusion bonding, plasma activated bonding, glass fit bonding, adhesive bonding, reactive bonding and the like. Flip wafer substrate 570 may have a reflective or partially reflective bottom surface, e.g., the surface facing light emitting diode layers 550. Flip wafer substrate 570 may or may not be flush with the top of light emitting diode layers 550. For example, fill material 560 may or may not separate light emitting diode layers 550 from flip wafer substrate 570.

Figure 5C:
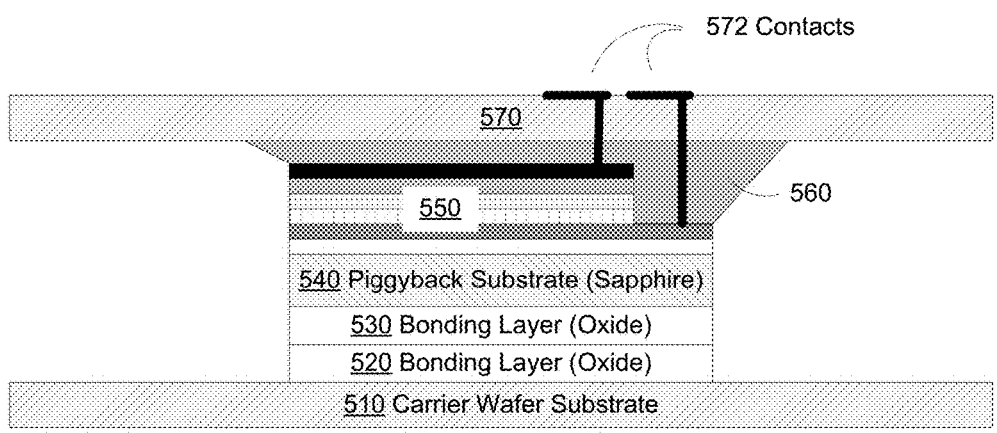

FIG. 5C illustrates formation of conductive vias through flip wafer substrate 570 to form contacts 572, in accordance with embodiments of the present invention. The vias may be formed in flip wafer substrate 570 prior to or after attachment, in accordance with embodiments of the present invention.

FIG. 5C also illustrates an optional partial removal of fill 560 from a region above carrier wafer 510. Any suitable process may be used to partially remove portions of fill 560. Alternatively, a lesser amount of fill 560, corresponding approximately to FIG. 5C, may be applied.

Figure 5D:
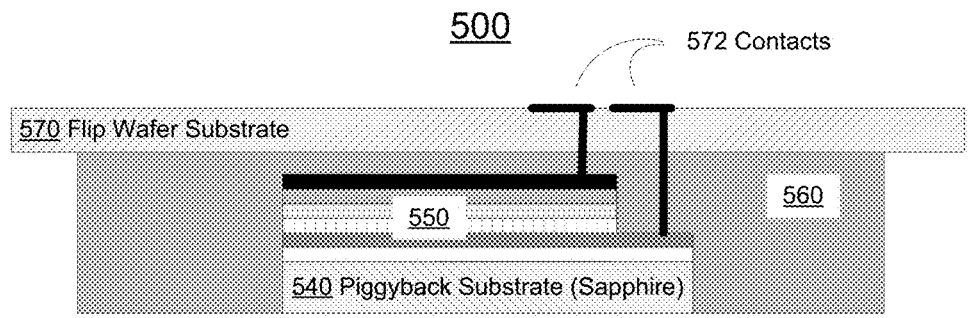

In FIG. 5D, carrier wafer 510 and any bonding layers, e.g., bonding layers 520, 530, are removed. The bottom of piggyback wafer substrate 540 may be polished, e.g., to improve optical and/or thermal characteristics.

Figure 5E:
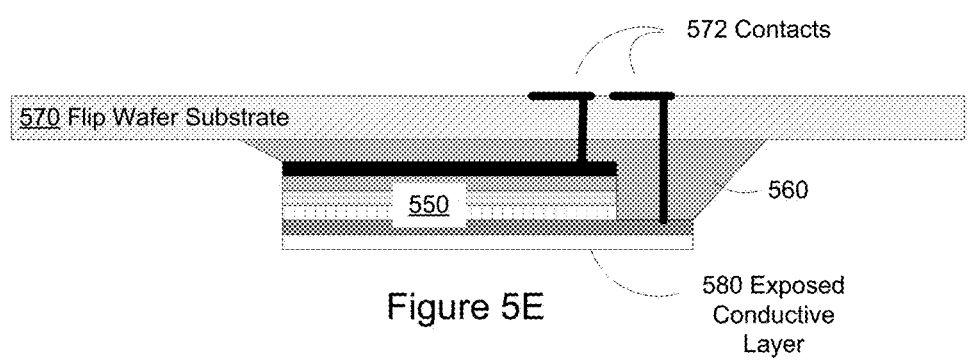

In accordance with an embodiment of the present invention, FIG. 5E illustrates removal of piggyback wafer substrate 540, exposing a conductive layer 580 of the light emitting diode layers 550, e.g., corresponding to layer 244 of FIG. 3. The piggyback substrate 540 may be removed via a laser lift-off (LLO) process, for example using a Krypton fluoride (KrF) and/or Argon fluoride (ArF) laser to decompose GaN or a thin sacrificial Aluminum nitride (AlN) layer 515. It is to be appreciated that a laser lift off process may remove an undoped, low-temperature buffer layer, e.g., buffer layer 241 of FIG. 3, in addition to removing a piggyback substrate, e.g., piggyback substrate 540. In such a case, A process to remove a piggyback substrate may benefit from using a carrier substrate material that is transparent to the light of such lasers, e.g., quartz or fused silica. Such lasers generally emit in the ultra-violet range of the spectrum. For example, it may be possible to remove a carrier substrate and a piggyback substrate in a single operation, for example, by separating the piggyback substrate from the emitting diode layers while the piggyback wafer substrate 540 and the carrier substrate material 540 are still bonded together.

In accordance with embodiments of the present invention, removal of a piggyback substrate, e.g., the substrate upon which the LED was formed, may have advantages in light extraction and thermal management, in comparison with devices that leave such a substrate in place. For example, sapphire has a relatively low refractive index, e.g., about 1.78. Accordingly, the presence of even a very thin, e.g., 100 nm, sapphire layer will tend to trap light within the LED stack. For comparison, materials that may commonly form an LED stack generally have a higher refractive index. For example, GaN has a refractive index of 2.45, GaP, has a refractive index of 3.5 and/or GaAs, has a refractive index of 3.9.

In accordance with embodiments of the present invention, the exposed surface of exposed conductive layer 580 may be roughened by a selective wet etch, e.g., using alkaline etchants such as Potassium hydroxide (KOH) or Tetramethylammonium hydroxide ((CH$_3$)$_4$NOH, TMAH). Such a process may disrupt internal reflections enabling more light to escape from the semiconductor layer.

In addition, heat dissipation may be improved by the removal of a sapphire substrate due to the poor thermal conductivity of sapphire, in accordance with embodiments of the present invention.

Figure 5F:
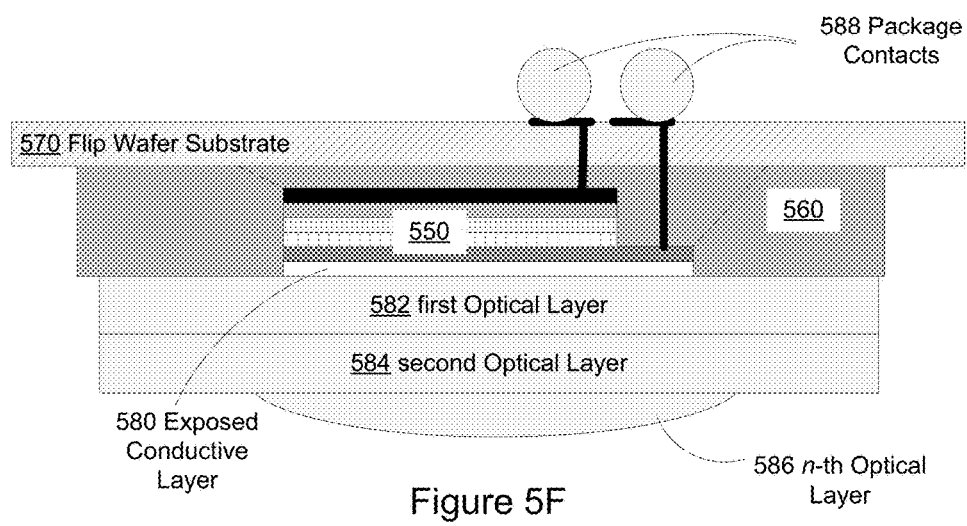

In FIG. 5F, proceeding from the situation of either FIG. 5D or FIG. 5E, a plurality of optical layers, e.g., first optical layer 582, second optical layer 584 and n-th optical layer 586 are fabricated over the "bottom" of the light emitting diode 550 and/or piggyback substrate 540 (if present), in a manner similar to that previously described with respect to FIG. 3. The optical layers function to couple the light emitted from the light emitting diode 550 to free space. One or more of optical layers 582-586 may form optical lenses. In general, a plurality of optical layers should form a progression of refractive indices from the refractive index of the LED itself to that of air. For example, the optical layer material with the highest refractive index should be closest to the LED, and the optical layer material with the lowest refractive index should be farthest from the LED.

In accordance with embodiments of the present invention, one or more of optical layers 582-586 may comprise a coating of phosphor(s) to produce a phosphor-based white LED.

FIG. 5F also illustrates package contacts 588, formed on the "top" surface of flip wafer substrate 570. Package contacts 588 electrically couple the electronics of light emitting diode layers 550 to outside electronics, e.g., via a printed circuit board, and may comprise, for example, solder balls, Controlled Collapse Chip Connection ("C4") and/or wire bonding contacts.

It is appreciated that the light emitting diode device of FIG. 5F is "upside down" or "flipped" with respect to the light emitting diode device previously described with respect to FIG. 3. For example, light is emitted from device 300 (FIG. 3) in the direction of the build up of layers of the light emitting diode, and away from the carrier wafer (removed or not) and away from the piggyback substrate (removed or not).

In contrast, as illustrated in FIG. 5F, light is emitted from the overall device in the direction opposite of the build up of layers of the light emitting diode, and toward the piggyback substrate (removed or not). Accordingly, such differences in construction may be advantageous based on the emission characteristics of a particular lay up of a light emitting diode.

Figure 6:
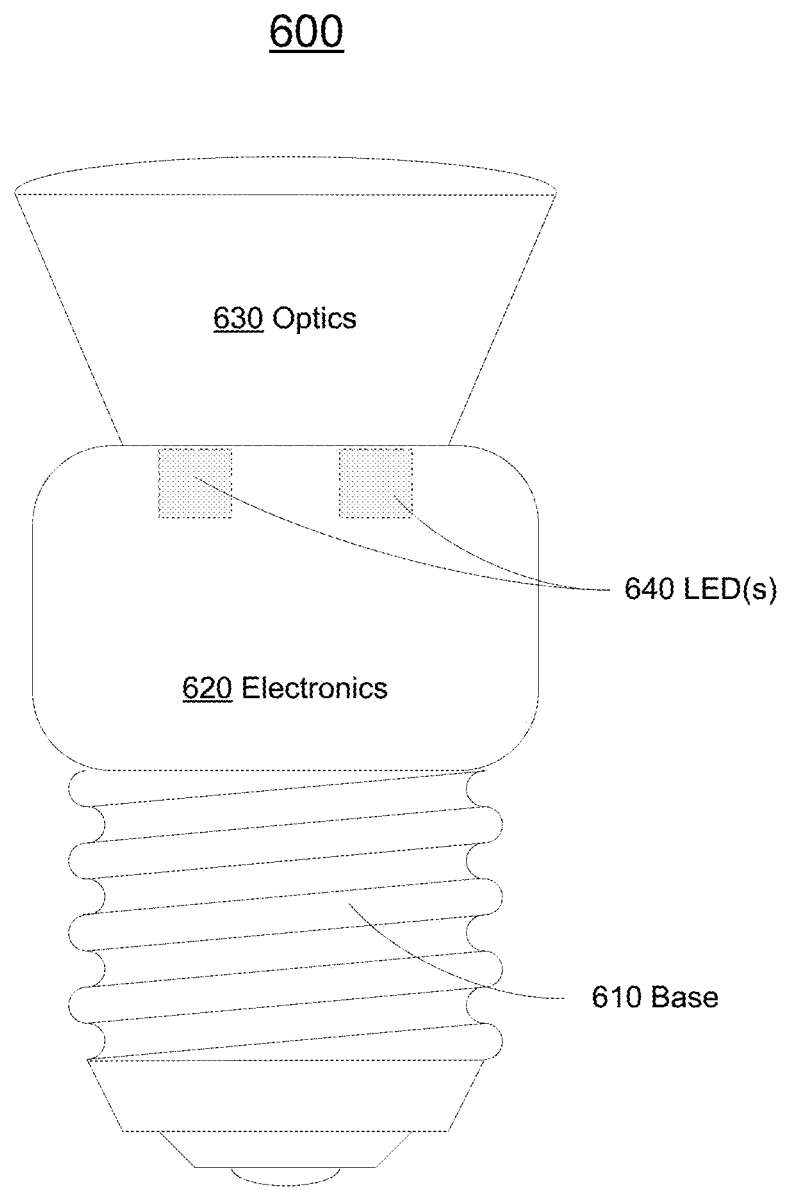
FIG. 6 illustrates an example of an application of a light emitting diode, in accordance with embodiments of the present invention.

FIG. 6 illustrates an example of an application of a light emitting diode, in accordance with embodiments of the present invention. Light source 600 is well suited to a variety of lighting applications, including domestic, industrial and landscape lighting. Light source 600 is also well suited to stage or theatrical lighting. Light source 600 comprises a base 610. As illustrated, base 610 is an Edison type base. It is appreciated that embodiments in accordance with the present invention are well suited to other types of bases, including, for example, GU, bayonet, bipin, wedge or other type of bases.

Light source 600 additionally comprises a body portion 620 that houses power conditioning electronics (not shown) that convert 110V AC input electrical power (or 220 V AC, or other selected input electrical power) to electrical power suitable for driving a plurality of light emitting diode devices 640. Body portion 620 may also comprise, or couple to, optional heat sink features (not shown).

Light source 600 additionally comprises optional optics 630. Optics 630 comprise diffusers and/or lenses for focusing and/or diffusing light from the plurality of light emitting diode devices 640 into a desired pattern.

Light source 600 comprises a plurality of light emitting diode devices (LEDs) 640. Individual LEDs of plurality of light emitting diode devices 640 may correspond to assemblies previously described herein. For example, plurality of light emitting diode devices 640 may include instances of singulated dice 170, 180 and/or 190. In addition, plurality of light emitting diode devices 640 may include instances of light emitting diode device 300. Further, plurality of light emitting diode devices 640 may include instances of light emitting diode devices as described in FIGS. 5A-5F. It is appreciated that not all instances of plurality of light emitting diode devices 640 need be identical.

It is to be further appreciated that plurality of light emitting diode devices 640 may include a single substrate comprising multiple light emitting devices. For example, a single instance of plurality of light emitting diode devices 640 may comprise a plurality of individual, different, LED devices formed on a common substrate. For example, as previously described, an instance of die 170 may be a blue light emitting diode comprising a sapphire substrate. An instance of die 180 may be a green light emitting diode comprising a Gallium phosphide (GaP) substrate. An instance of die 190 may be a red light emitting diode comprising a Gallium arsenide (GaAs) substrate. The three instances of dice 170-190 may be arranged in an array on carrier wafer 110 such that the light from such three colors may be combined to produce a variety of spectral colors. For example, an instance of plurality of light emitting diode devices 640 may comprise dice 170-190 in combination to produce a "white" light output.

In accordance with embodiments of the present invention, plurality of light emitting diode devices 640 may include additional electronics associated with the LED devices, e.g., as previously described with respect to other structures 260 of FIG. 2. In one exemplary embodiment, such additional electronics may comprise circuits to implement a white balance among tri-color LEDs, e.g., 170, 180 and 190.

Figure 7:
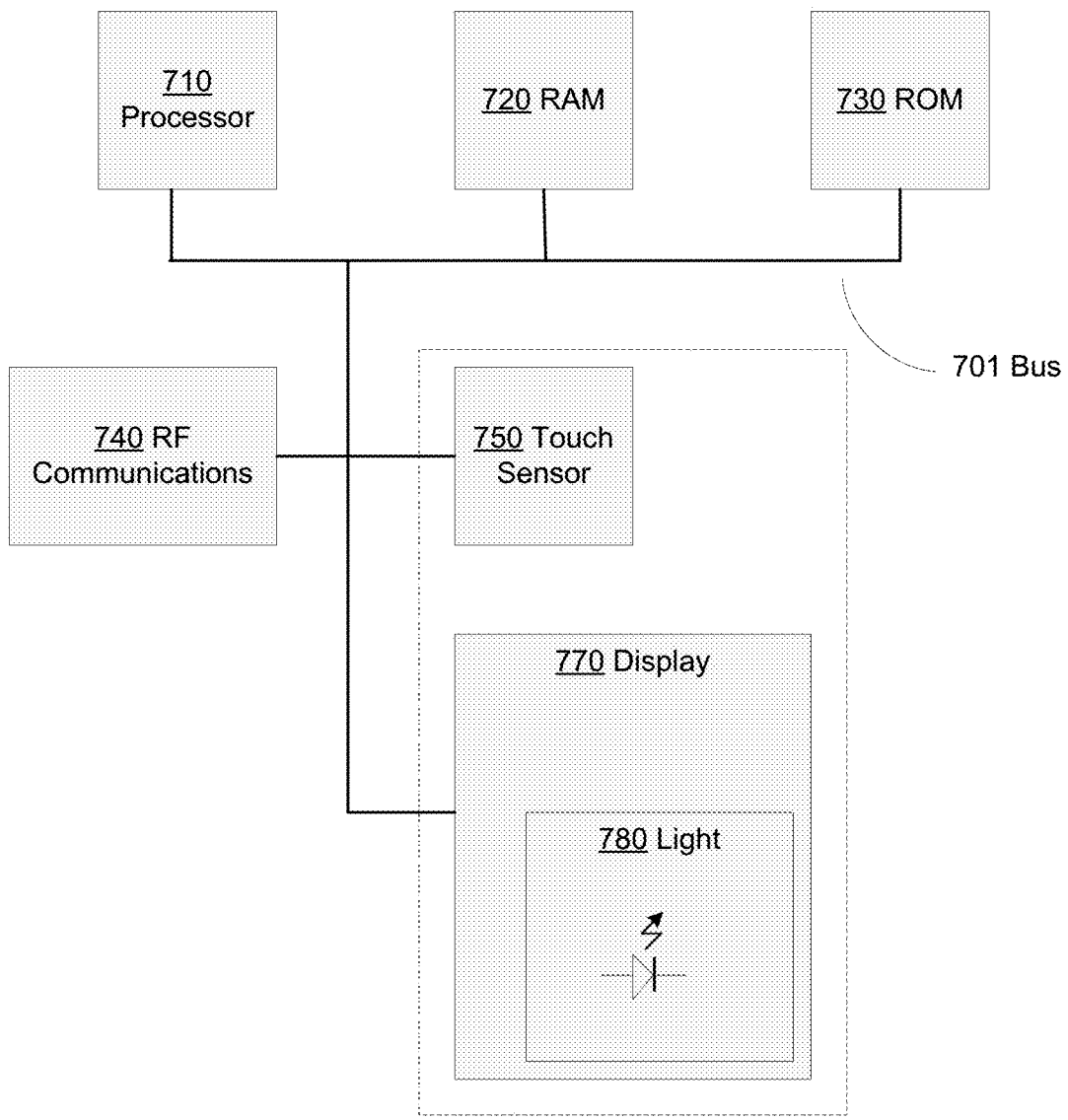
FIG. 7 illustrates an exemplary portable computer system, in accordance with embodiments of the present invention.

FIG. 7 illustrates an exemplary portable computer system 700, in accordance with embodiments of the present invention. Portable computer system 700 may be a mobile phone or smart phone, email device, tablet, laptop or netbook computer, personal digital assistant or the like. A bus 701 functionally couples the various functional blocks of system 700. Bus 701 may comprise multiple busses, and any such bus may be a single conductor.

Portable computer system 700 comprises a processor 710. Processor 710 may be any type of processor for executing software, and may comprise multiple distinct processors, including central processing units and graphical processing units. Processor 710 may also be a multi-core device. Processor 710 generally controls the operation of portable computer system 700, and may operate a graphical user interface. For example, processor 710 accepts input, e.g., from touch sensor 750 and/or optional RF communications 740, and may produce output, e.g., to display 770 and/or RF communications 740. Processor 710 may access random access memory (RAM) 720 for programs and/or data, and may also access read only memory (ROM) for programs and/or data.

Portable computer system 700 optionally comprises a radio-frequency (RF) communications subsystem 740. RF communications system 740 is well suited to operate on a variety of radio communication protocols, including, for example, data and/or telephony networks, e.g., Bluetooth, WiFi, TDMA, CDMA, GSM, AMPS and the like. RF communications system 740, if present, operates to communicate voice, image and/or data to and from portable communication system 700.

Portable computer system 700 comprises a touch sensor subsystem 750. Touch sensor 750 may operate as a resistive or capacitive device, and generally functions to accept input to system 700 in the form of a touch, e.g., from a finger and/or a stylus. Touch sensor 750 is generally strongly associated with a display device. For example, a user of system 700 may perceive touching a "screen" rather than a separate touch sensor.

Portable computer system 700 also comprises a display device 770. Display 770 may be any suitable technology, including, for example, an STN or TFT LCD display device Display 770 functions to output images and/or alpha-numeric information from system 700

Portable computer system 700 further includes a light 780 to illuminate display 770. For example, most LCD devices do not directly produce light; rather such devices filter light from another source, e.g., light 780. Alternatively, light 780 may provide supplemental illumination when ambient light is insufficient for viewing display 770.

In accordance with embodiments of the present invention, light 780 comprises a plurality of light emitting diodes. Individual LEDs of plurality of light emitting diode devices 780 may correspond to assemblies previously described herein. For example, plurality of light emitting diode devices 780 may include instances of singulated dice 170, 180 and/or 190. In addition, plurality of light emitting diode devices 780 may include instances of light emitting diode device 300. Further, plurality of light emitting diode devices 780 may include instances of light emitting diode devices as described in FIGS. 5A-5F. It is appreciated that not all instances of plurality of light emitting diode devices 780 need be identical.

Light 780 may illuminate display 770 from the front and/or the back and/or the sides of display 770, and may be referred to as a front light, back light and/or side light. Light from light 780 may be coupled to the display by a diffuser in front of or behind display 770.

Embodiments in accordance with the present invention provide systems and methods for inverted optical devices. In addition, embodiments in accordance with the present invention provide systems and methods for inverted optical devices that enable dissimilar substrates to benefit from process machinery optimized for large substrates. Further, embodiments in accordance with the present invention provide systems and methods for inverted optical devices that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. An apparatus comprising:
   a non-conducting substrate structure comprising glass, fused silica, plastic-based materials, glass-reinforced epoxy, metal-core printed circuit board materials, ceramics, or organic materials;
   a light emitting diode semiconductor structure having a pair of semiconductor contact layer surfaces,
      wherein a substrate upon which said light emitting diode semiconductor structure was fabricated is absent,
      wherein said pair of semiconductor contact layer surfaces face said substrate structure and are in electrical contact with package contacts on the opposite side of the substrate structure,
      wherein one semiconductor contact layer surface is in direct contact with a first single conductive via which electrically connects the semiconductor contact layer surface through the substrate structure to a first package contact, and the other semiconductor contact layer surface is in direct contact with a second single conductive via which electrically connects the other semiconductor contact layer surface through the substrate structure to a second package contact; and
   an insulating material coupling said light emitting diode semiconductor structure to said substrate structure.

2. The apparatus of claim 1, wherein the substrate structure comprises a reflective surface on a non-light transmissive said of substrate structure.

3. The apparatus of claim 2 further comprising: a base for coupling to an alternating current supply; and electronics configured to convert said alternating current to electrical power suitable for driving said light emitting diode.

4. The apparatus of claim 2 further comprising: a processor for operating a graphical user interface; a display for displaying said graphical user interface; and
wherein said light emitting diode is configured to illuminate said display.

5. The apparatus of claim 1, wherein the contact layer surfaces are in contact with a light emitting diode structure includes a surface that is roughened through which light is emitted.

6. The apparatus of claim 5 wherein the roughened surface is adjacent to an optical layer.

7. The apparatus of claim 1 wherein said substrate structure comprises a non-crystalline interface with said light emitting diode semiconductor structure.

8. The apparatus of claim 1, wherein said substrate structure is not the fabrication substrate of the light emitting diode structure.

9. The apparatus of claim 1 wherein a last sequentially fabricated layer of said light emitting diode semiconductor structure is closest to said substrate structure.

10. The apparatus of claim 1 further comprising a plurality of optical layers adjacent to and coupled to said light emitting diode semiconductor structure, opposite of said substrate structure.

11. The apparatus of claim 10 wherein one of said plurality of optical layers having the highest refractive index is placed closest to said light emitting diode semiconductor structure.

12. The apparatus of claim 10 wherein one of said plurality of optical layers having the highest refractive index is placed closest to said light emitting diode semiconductor structure.

13. The apparatus of claim 10 wherein a doped conductive layer of said light emitting diode semiconductor structure is in contact with one of said plurality of optical layers.

14. The apparatus of claim 1 further comprising conductive structures electrically coupling and directly contacting said pair of contact layer surfaces to the package contacts on said substrate structure.

15. The apparatus of claim 14 wherein said package contacts are on a surface of said substrate structure away from said light emitting diode semiconductor structure.

16. The apparatus of claim 1 wherein said substrate structure comprises a conductive pathway for electrically coupling at least one of said pair of contact layer surfaces to its respective package contact on said substrate structure.

17. The apparatus of claim 1 further comprising a fabrication substrate comprising a crystalline interface to said light emitting diode semiconductor structure.

18. The apparatus of claim 17 wherein said insulating material is disposed between said substrate structure and said fabrication substrate.

* * * * *